(12) United States Patent
Chakraborty et al.

(10) Patent No.: US 11,704,452 B2
(45) Date of Patent: Jul. 18, 2023

(54) SYSTEMS AND METHODS FOR DETERMINING A NATURAL FREQUENCY OF A STRUCTURE

(71) Applicant: Board of Regents, The University of Texas System, Austin, TX (US)

(72) Inventors: Sayantan Chakraborty, Arlington, TX (US); Jasaswee T. Das, Arlington, TX (US); Aritra Banerjee, Arlington, TX (US); Anand J. Puppala, Southlake, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 1211 days.

(21) Appl. No.: 16/209,619

(22) Filed: Dec. 4, 2018

(65) Prior Publication Data
US 2019/0171790 A1  Jun. 6, 2019

Related U.S. Application Data

(60) Provisional application No. 62/594,390, filed on Dec. 4, 2017.

(51) Int. Cl.
*G06F 30/17* (2020.01)
*E02D 33/00* (2006.01)
*G06F 30/23* (2020.01)
*G01H 13/00* (2006.01)
*G01M 5/00* (2006.01)
*G01M 7/02* (2006.01)

(52) U.S. Cl.
CPC .............. *G06F 30/17* (2020.01); *E02D 33/00* (2013.01); *G01M 5/0066* (2013.01); *G01M 7/02* (2013.01); *G06F 30/23* (2020.01); *E02D 2200/00* (2013.01); *G01H 13/00* (2013.01)

(58) Field of Classification Search
CPC .. E02D 33/00; E02D 2200/00; G01M 5/0066; G01M 7/02; G01H 13/00; G06F 30/17; G06F 30/23
USPC .......................................................... 703/7
See application file for complete search history.

(56) References Cited

U.S. PATENT DOCUMENTS 10,295,435 B1 *  5/2019  Wu .................... G01M 7/02

FOREIGN PATENT DOCUMENTS

| AT | 506324 B1 * | 8/2009 | .......... G01M 5/0008 |
|---|---|---|---|
| FR | 3074293 A1 * | 5/2019 | |
| JP | 3705357 B2 * | 10/2005 | |
| JP | 4142793 B2 * | 9/2008 | |

\* cited by examiner

*Primary Examiner* — Lisa M Caputo
*Assistant Examiner* — Rose M Miller
(74) *Attorney, Agent, or Firm* — Thomas Horstemeyer, LLC

(57) ABSTRACT

In one embodiment, a system and method for determining a natural frequency of a structure involve modeling the structure, creating a synthesized excitation comprising a plurality of waves having various frequencies within a defined range of frequencies, applying the synthesized excitation to a base of the modeled structure, and generating response data indicative of a natural frequency of the modeled structure that is based upon the application of the synthesized excitation.

16 Claims, 6 Drawing Sheets

SYSTEMS AND METHODS FOR DETERMINING A NATURAL FREQUENCY OF A STRUCTURE

CROSS-REFERENCE TO RELATED APPLICATION

This application claims priority to U.S. Provisional Application Ser. No. 62/594,309, filed Dec. 4, 2017, which is hereby incorporated by reference herein in its entirety.

BACKGROUND

A number of techniques have been developed to study the response of structures to excitations, such as seismic events. Understanding structural behavior plays an important role in evaluating the stability and predicting the deformation response of the structures when subjected to excitation events. Determination of one or more natural frequencies of vibration (or "natural frequencies") of a structure is key in this type of analysis. The natural frequencies of an undamped single degree of freedom (SDOF) structure depend on the mass m and stiffness k of the structure, according to the equation $$f = \frac{1}{2\pi}\sqrt{\frac{k}{m}}.$$

Structures tend to have lower natural frequencies when they are heavier (m↑), less rigid (k↓), or both. The natural frequencies of engineered structures, which are multi-degree of freedom systems, depend primarily on the geometric configurations, material properties, and boundary conditions.

The natural frequencies of earthen embankment structures, such as dams, levees, and highway embankments, are normally determined through application of various methods, such as the shear-beam approach, free-vibration method, eigen-value analysis, and in-situ/on-site forced vibration tests. However, the vast majority of these theoretical and numerical methods do not account for the non-linear, anisotropic, and heterogeneous behavior of the material comprising the structure. Another disadvantage of conventional methods for determining the natural frequencies of structures is that they often are not effective in determining the natural frequencies of structures for excitations involving high strain levels, the strain level being a measure of the extent of disturbance that a structure undergoes during dynamic or seismic excitation. This limits the utility of these conventional approaches in determining the strain-dependent natural frequencies of the structures. Thus, a need remains for improved techniques for determining the natural frequencies of structures.

BRIEF DESCRIPTION OF THE DRAWINGS

The following figures form part of the present specification and are included to further demonstrate certain aspects of the present claimed subject matter, and should not be used to limit or define the present claimed subject matter. The present claimed subject matter may be better understood by reference to one or more of these drawings in combination with the description of embodiments presented herein. Consequently, a more complete understanding of the present embodiments and further features and advantages thereof may be acquired by referring to the following description taken in conjunction with the accompanying drawings, in which like reference numerals may identify like elements, wherein:

NOTATION AND NOMENCLATURE

Figure 1:
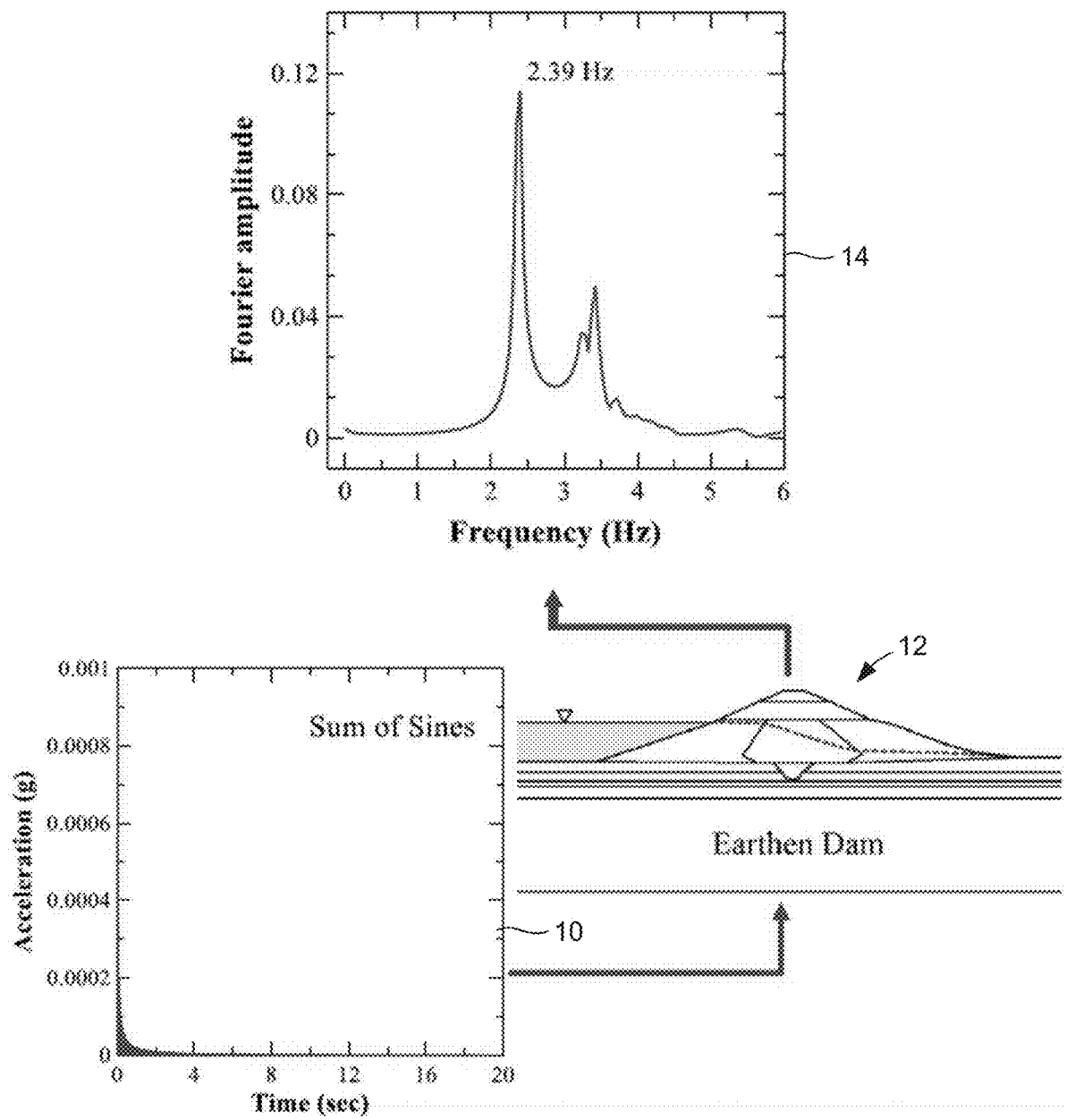
FIG. 1 schematically illustrates an embodiment of a method for determining a natural frequency of a structure based upon a synthesized excitation.

Certain terms are used throughout the following description and claims to refer to particular system components and configurations. As one skilled in the art will appreciate, the same component may be referred to by different names. This document is not intended to distinguish between components that differ in name but not function. In the following discussion and in the claims, the terms "including" and "comprising" are used in an open-ended fashion, and thus should be interpreted to mean "including, but not limited to . . . ." As used herein, the term "structure" encompasses any type of structure (e.g., buildings, dams, levees, embankments, towers, windmills, etc.) and thus is not to be limited to any specific structure.

DETAILED DESCRIPTION

The foregoing description of the figures is provided for the convenience of the reader. It should be understood, however, that the embodiments are not limited to the precise arrangements and configurations shown in the figures. Also, the figures are not necessarily drawn to scale, and certain features may be shown exaggerated in scale or in generalized or schematic form, in the interest of clarity and conciseness. The same or similar parts may be marked with the same or similar reference numerals.

While various embodiments are described herein, it should be appreciated that the present invention encompasses many inventive concepts that may be embodied in a wide variety of contexts. The following detailed description of exemplary embodiments, read in conjunction with the accompanying drawings, is merely illustrative and is not to be taken as limiting the scope of the invention, as it would be impossible or impractical to include all of the possible embodiments and contexts of the invention in this disclosure. Upon reading this disclosure, many alternative embodiments of the present invention will be apparent to persons of ordinary skill in the art. The scope of the invention is defined by the appended claims and equivalents thereof.

Illustrative embodiments of the invention are described below. In the interest of clarity, not all features of an actual implementation are described in this specification. In the development of any such actual embodiment, numerous implementation-specific decisions may need to be made to achieve the design-specific goals, which may vary from one implementation to another. It will be appreciated that such a development effort, while possibly complex and time-consuming, would nevertheless be a routine undertaking for persons of ordinary skill in the art having the benefit of this disclosure.

As described above, a need remains for improved techniques for determining the natural frequencies of structures because conventional techniques do not account for the non-linear, anisotropic, and heterogeneous behavior of the material comprising the structure and/or are not effective in determining the natural frequencies of structures for excitations involving high strain levels. Disclosed herein are systems and methods for determining the natural frequencies of a structure for different modes of vibration. In some embodiments, the natural frequency of the first mode of vibration for a structure is determined at a variety of strain levels for a given range of frequencies of excitation. A premise upon which the systems and methods are based is that structures act as filters for excitation waves of different frequencies. For example, in the case of earthen structures, such as dams or levees, the structures act as filters to seismic waves of different frequencies. When a seismic wave impacts the foundation of a structure (e.g. a dam), only the frequency components that are close to the structure's natural vibration periods are magnified due to strong resonant excitation.

In accordance with the above premise, natural frequencies of a structure can be determined by applying a synthesized excitation comprising a plurality of waves having a variety of frequencies to a model of the structure and observing which frequencies of the structure are excited by the waves. Those frequencies correspond to the natural frequencies of the structure. In some embodiments, the synthesized excitation comprises a summation of all possible sinusoidal waves within a particular (e.g., user-defined) frequency range having a predefined frequency resolution. The synthesized excitation can, therefore, be referred to as a synthesized "sum of sines" excitation. In some embodiments, the amplitude of each sinusoidal wave is kept the same to avoid bias toward exciting a particular frequency of vibration of the structure. The number of superimposed sinusoidal waves comprised by the sum of sines excitation depends upon the frequency range for the excitation and the frequency increment. By way of example, the sum of sines excitation can comprise 250 to 5000 superimposed sinusoidal waves having various frequencies within the selected range. In some embodiments, the sum of sines excitation can be mathematically defined as:

$$Acc(t) = \frac{PHA}{\max\left(\sum_{i=1}^{i=F/f} \sin(2*\pi*f*i*t)\right)} \sum_{i=1}^{i=F/f} \sin(2*\pi*f*i*t); \quad (1)$$

$$0 \text{ sec} \le t \le T \text{ sec}$$

wherein Acc is the synthesized excitation (or "acceleration"), PHA is peak horizontal acceleration of the excitation, F is the upper limit of the frequency range of the excitation (greater than 0), f is the resolution of the frequency scale, t is the time instant, and T is the duration of the excitation. As noted above, the sum of sines excitation is used as an input into the structure model. In some embodiments, the model can be generated using a software application that is configured to model the structure that is to be evaluated. Examples of such software applications include those that provide finite-element method (FEM) or finite-difference method (FDM) analysis. For example, commercial software, such as that available from GEO-SLOPE (www.geoslope.com), provides geotechnical modeling applications that can be used to generate a model based upon various parameters input by the user.

Experiments were performed to evaluate the use of a sum of sines excitation in determining a natural frequency of a structure. Five different embankment structures of varying complexities in geometry and material properties were selected for the experiments. The accuracy of the disclosed methods was confirmed by a comparison of the real natural frequency reported for these structures (at low strain) with that obtained using the disclosed method. FIG. 1 provides an example of structure analysis that was conducted using the sum of sines excitation. Stated otherwise, FIG. 1 provides an example of a method for determining a natural frequency of a structure.

First, a specific sum of sines excitation was created using Equation 1. Values were selected for each variable in the equation. In this example, PHA was initially selected to be 0.001 g, F was selected to be 25 Hz, f was selected to be 0.01 Hz, t was selected to be 0.02 s, and T was selected to be 20 s. This excitation is plotted in graph 10 at the lower left corner of FIG. 1. In that graph, the sum of sines excitation is plotted as a function of acceleration versus time. Once the sum of sines excitation was created, a model of the structure at issue was developed using an FEM/FDM software application. In this example, the structure was modeled as an earthen dam, as depicted by the two-dimensional structure 12 shown in the lower right corner of FIG. 1. Various parameters were input into the FEM/FDM software application to define the structure, including geometry details, zone/layer details, material properties (from laboratory tests, field tests, historical records), non-linearity data (shear modulus degradation curve and variation of damping ratio with strain), boundary condition details, and other customary data parameters as known by those skilled in the art.

After the modeling was completed, the sum of sines excitation was applied to the base of the modeled dam as a horizontal disturbance (as would a seismic disturbance) to obtain a response. This response of the modeled structure at the crest (top) of the structure, which is indicative of the natural frequency of the entire structure, was output as acceleration and time data in the time domain. These data were then converted from the time domain into the frequency domain using a fast Fourier transform (FFT) algorithm. In some embodiments, this can be achieved using commercial software, such as MATLAB®. The frequency domain response is plotted in the graph 14 at the top of FIG. 1. This graph 14 plots the Fourier amplitude (corresponding to acceleration magnitude) at the center of the crest of the dam versus frequency that resulted from the application of sum of sines excitation. As is apparent from the graph 14, the first and largest peak of the plot occurred at 2.39 Hz, indicating that the natural frequency of the first mode of vibration of the modeled dam was 2.39 Hz.

Figure 2:
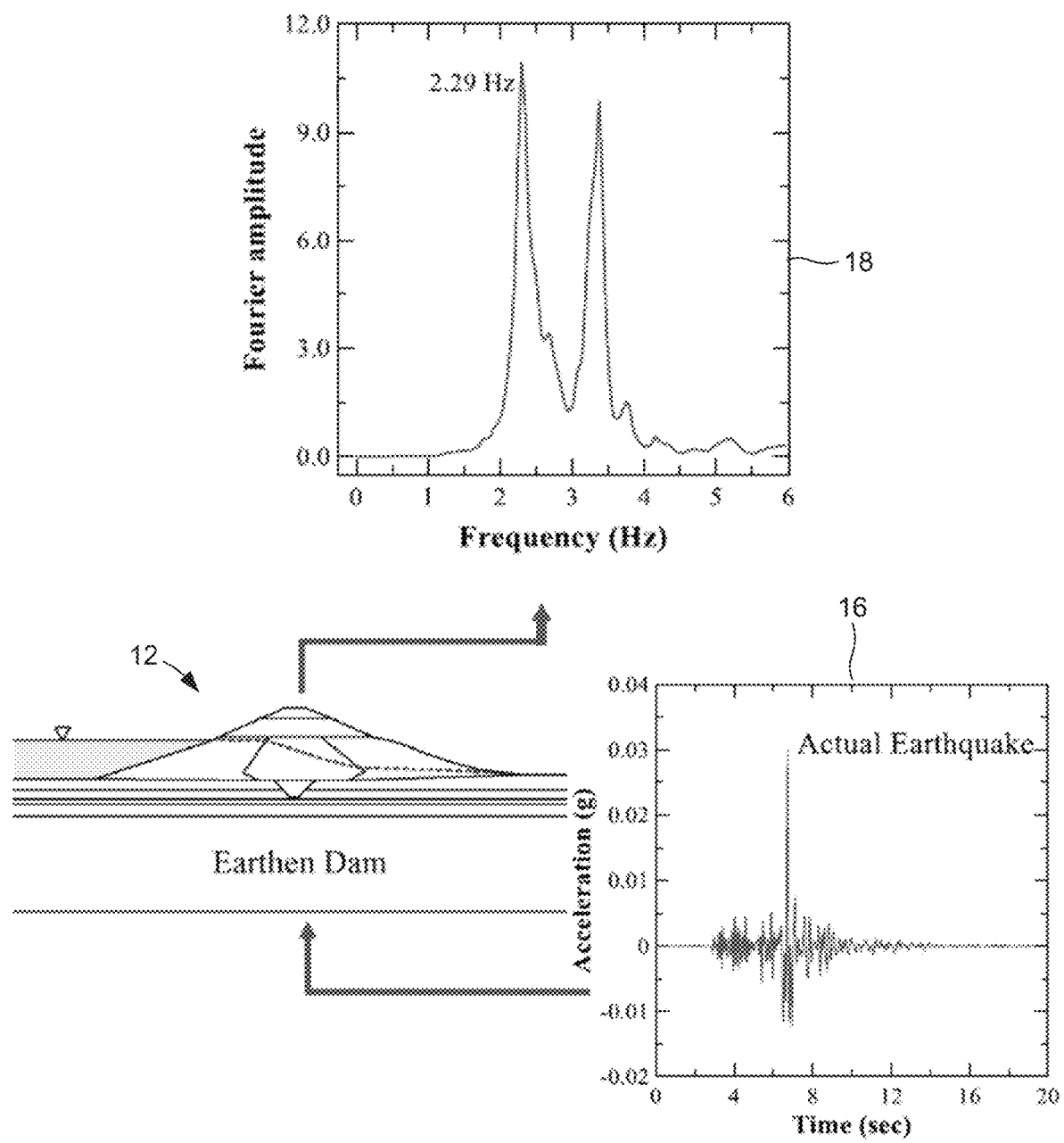
FIG. 2 schematically illustrates an embodiment of a method for determining a natural frequency of the structure of FIG. 1 based upon an actual earthquake excitation.

Next, with reference to FIG. 2, real earthquake data was input into the modeled dam as an excitation for purposes of comparison. A plot of an actual earthquake excitation (acceleration vs. time) is depicted in the graph 16 in the lower right corner of FIG. 2. This real excitation data was input into the same modeled structure 12 used in the analysis depicted in FIG. 1. The plot in the graph 18 at the top of FIG. 2 shows the model outputs of the response in the frequency domain.

In particular, plotted is the Fourier amplitude versus frequency at the crest of the dam resulting from the actual earthquake excitation applied at the base of the dam. As shown in this graph 20, the natural frequency of the modeled dam was determined to be 2.29 Hz. Notably, this value was slightly lower than the 2.39 Hz determined using the sum of sines excitation as the actual earthquake excitation was higher (i.e., PHA=0.03 g vs. 0.001 g for sum of the sines excitation).

Figure 3:
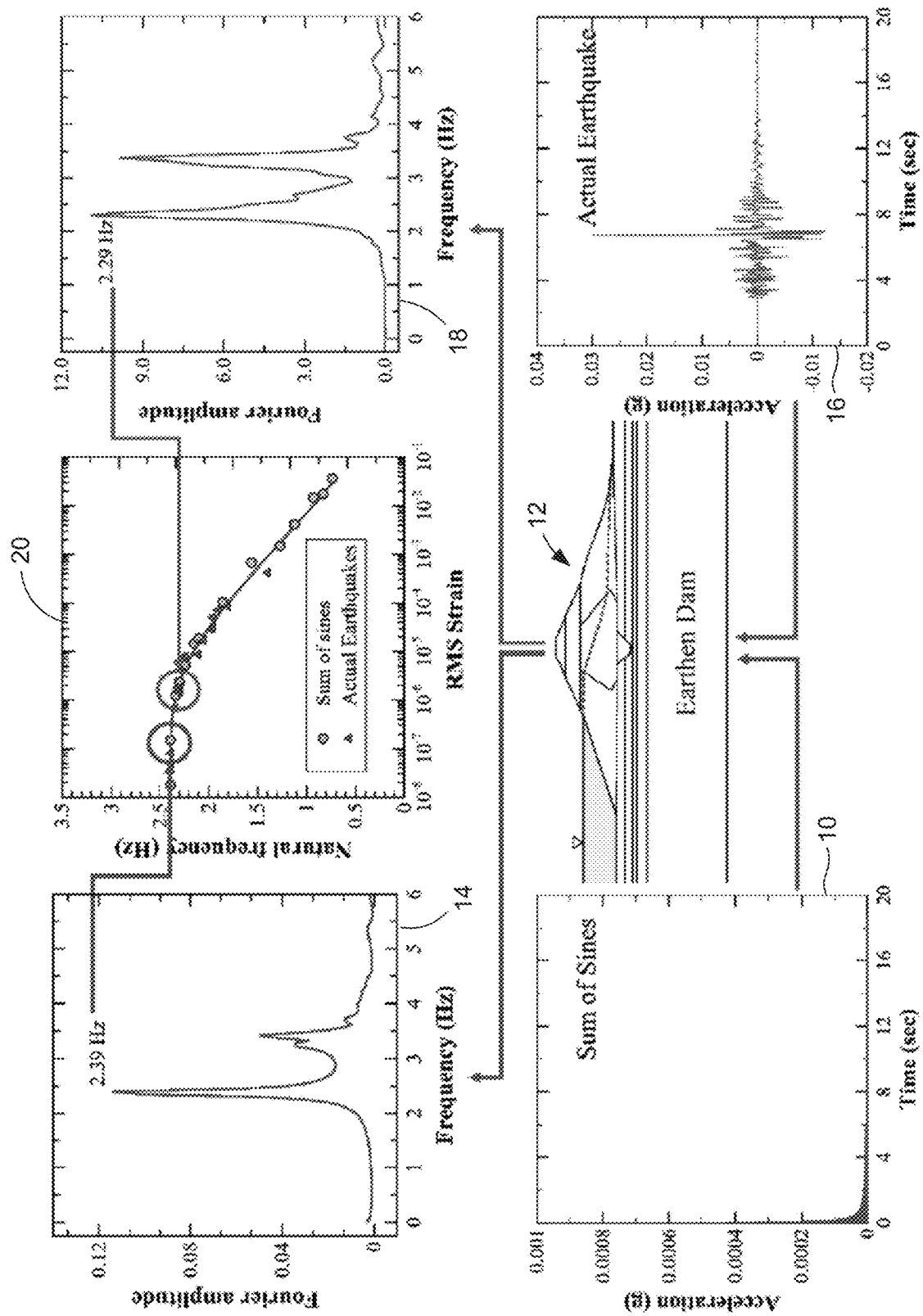
FIG. 3 schematically illustrates a comparison of the methods and results of the methods of FIGS. 1 and 2.

FIG. 3 provides a comparison of data obtained by applying the sum of sines excitation (see FIG. 1) and applying the real earthquake excitation data (see FIG. 2). The process described in relation to FIG. 2 was repeated for various PHA values to examine how the natural frequency of the modeled dam changed as a function of the intensity of the excitation. The observed natural frequencies were plotted as a function of root-mean-square (RMS) strain, as shown in the graph 20 in the top center of FIG. 3. In some embodiments, the software application using to model the structure generates the RMS strain values. Each of the natural frequencies, including the 2.39 Hz natural frequency, is plotted in the graph 20 with a circle symbol. As can be appreciated from these circle symbols, the natural frequency of the modeled dam was near the 2.39 Hz level for small strain levels (~ less than $10^{-6}$) but decreased as the strain level increased. More particularly, the natural frequency of the modeled dam decreased in a linear fashion as the strain increased. This determination is significant as conventional methods described above would likely miss this trend and would output a natural frequency number near 2.39 Hz irrespective of strain level.

The determined natural frequencies were compared to natural frequency data obtained from five recorded actual earthquakes experienced by the particular dam, scaled to different PHAs to generate 21 different earthquake scenarios. Such actual earthquake time-history data was obtained from the U. S. Geological Survey (USGS) records (http://strongmotioncenter.org/). The analysis was performed using the geotechnical software for each of the 21 different earthquake cases and the strain-dependent natural frequency data corresponding to each particular recorded earthquake scenario was plotted using triangle symbols against the determined strain-dependent natural frequency data obtained by applying the sum of sines excitation to the modeled dam (circle symbols). As is apparent from the graph 16, the sum of sines-modeled natural frequency data points aligned well with the actual historical natural frequency data points for the particular dam structure.

Figure 4:
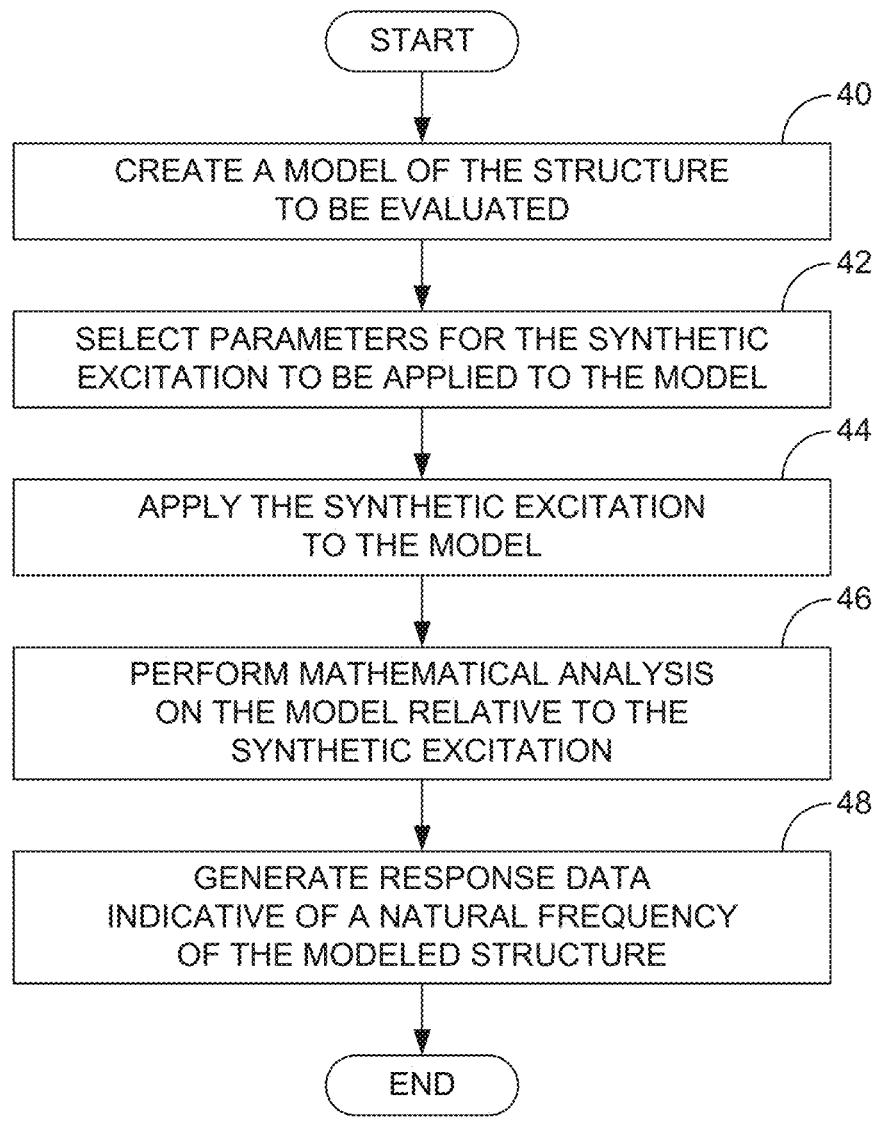
FIG. 4 is a flow diagram of an embodiment of a method for determining a natural frequency of a structure based upon a synthesized excitation.

FIG. 4 is a flow diagram of an embodiment of a method for determining the natural frequency of a structure consistent with the discussion provided above. Beginning with block 40, a model of a structure to be evaluated is created. As noted above, such a model can be created using existing software applications that are designed for this purpose. Examples include FEM- and FDM-based software applications. As part of the creation of the model, various parameters of the structure are selected and input by the user, such as a geometry parameter, a zone parameter, a material property parameter, a layer parameter, and a boundary parameter. A "drawing" of the structure may also be produced using the structure geometry parameter (input to scale). A zone parameter provides for the division of the structure into discrete zones/layers as required, to incorporate the effects of heterogeneity (as expected to exist in the field). The structure can be divided into several sections based on available information (e.g., from field tests such as cone penetration tests, boreholes, etc.). Material property parameters may be obtained from laboratory tests, field tests, literature, etc. The behavior of an earthen structure under seismic loading conditions depends on the material properties such as small strain shear modulus, damping ratio, unit weight, etc. A layer parameter provides for incorporation of the effect of non-linearity (e.g., modulus degradation curves of the different layers ($G/G_{max}$ vs. strain), or variation of the damping ratio of the different layers with strain). A boundary parameter provides for the assignment of any boundary conditions. For example, for an earthen dam, boundary conditions may include the total head at the upstream side. Applicable support conditions at the base and sides of the structure may also be assigned.

With reference next to block 42, the parameters of the simulated excitation (e.g., a simulated sum of sines excitation) are selected. As noted above, these parameters include the peak horizontal acceleration (PHA), the frequency range (F), the resolution of the frequency scale (f), the time instant (t), and the duration of the excitation (T). Selection of these parameters define the specific nature of the sum of sines excitation and, therefore, the nature of the disturbance that will be applied to the modeled structure. As noted above, the PHA can be scaled in an iterative fashion to observe how the intensity of the excitation (acceleration) affects the natural frequency of the structure. Hence, the effect of the material non-linearity (at different strain levels) can be incorporated in the analysis and identified, unlike as with existing methods.

Next, referring to block 44, the sum of sines excitation is applied to the model as a disturbance. As noted above, the excitation can be applied to the base of the modeled structure to simulate seismic excitation. With reference to block 46, mathematical analysis is then performed on the model relative to the sum of sines excitation using the modeling software application. Through this analysis, response data is generated, as indicated in block 48. As noted above, if these data are in the time domain, they can be converted into the frequency domain using FFT to obtain the natural frequencies of the modeled structure. In some embodiments, the response can be plotted as Fourier amplitude (corresponding to acceleration magnitude) versus frequency. The location of the first and largest peak is the determined natural frequency of the first mode of vibration of the system, which often is the most important natural frequency to know. Notably, this process can be repeated for each PHA to identify the natural frequency of the structure relative to magnitude of the excitation and, if desired, the identified natural frequencies can be plotted as a function of RMS strain (as in graph 20 of FIG. 3) to observe the variation of natural frequency with strain.

Figure 5:
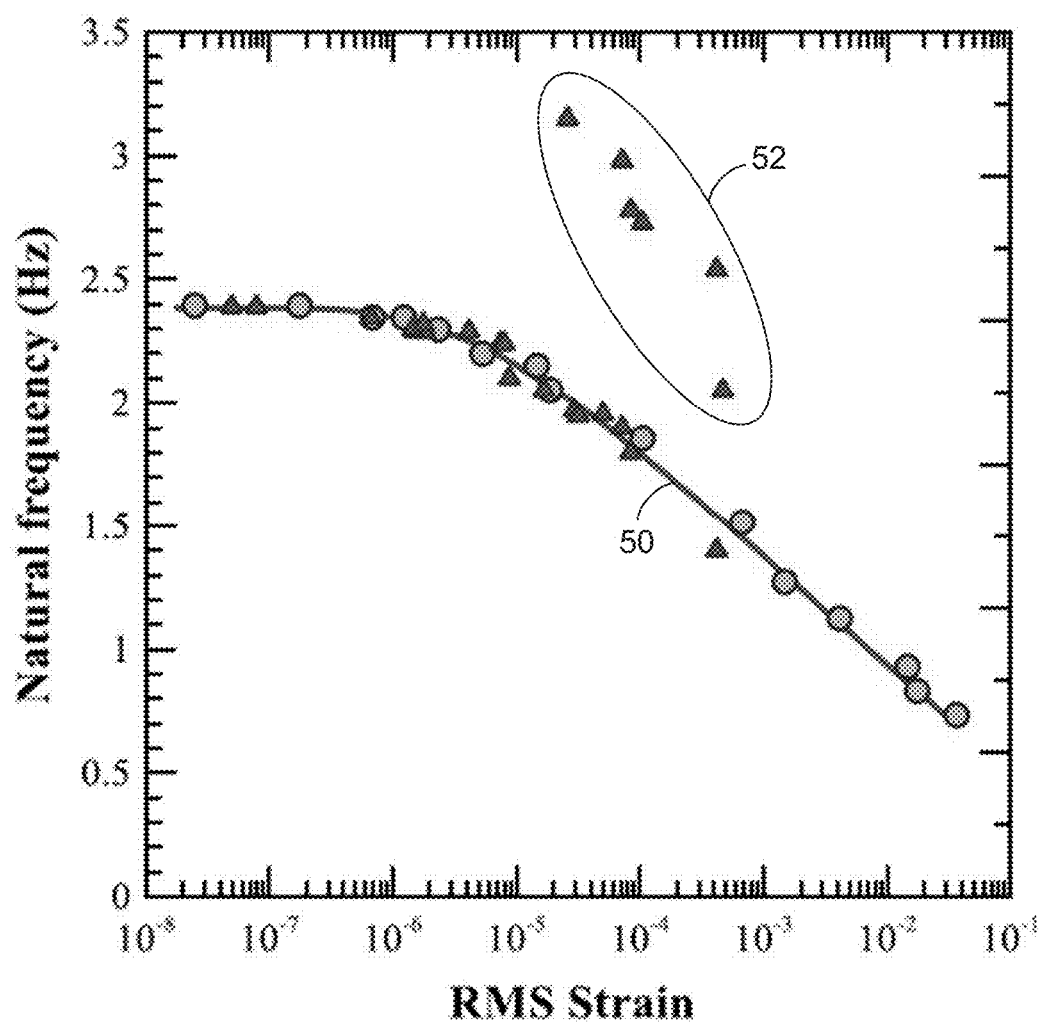
FIG. 5 is a graph that plots natural frequencies of a structure determined based upon a synthesized excitations and actual earthquake excitations for a variety of root-mean-square (RMS) strain values.

As described above, the PHA values can be scaled to simulate high-magnitude excitations (e.g., strong earthquakes). Such cases were also modeled using the disclosed methods. FIG. 5 is a graph that plots the natural frequency versus the RMS strain determined by the model using high-magnitude sum of sine excitations and actual seismic excitations. The trace line 50 in the graph shows the results obtained corresponding to the first mode of vibration of the structure. The plotted data points 52 off the trace line 32 for the actual seismic excitations correspond to higher modes of vibration other than the first mode of vibration.

Figure 6:
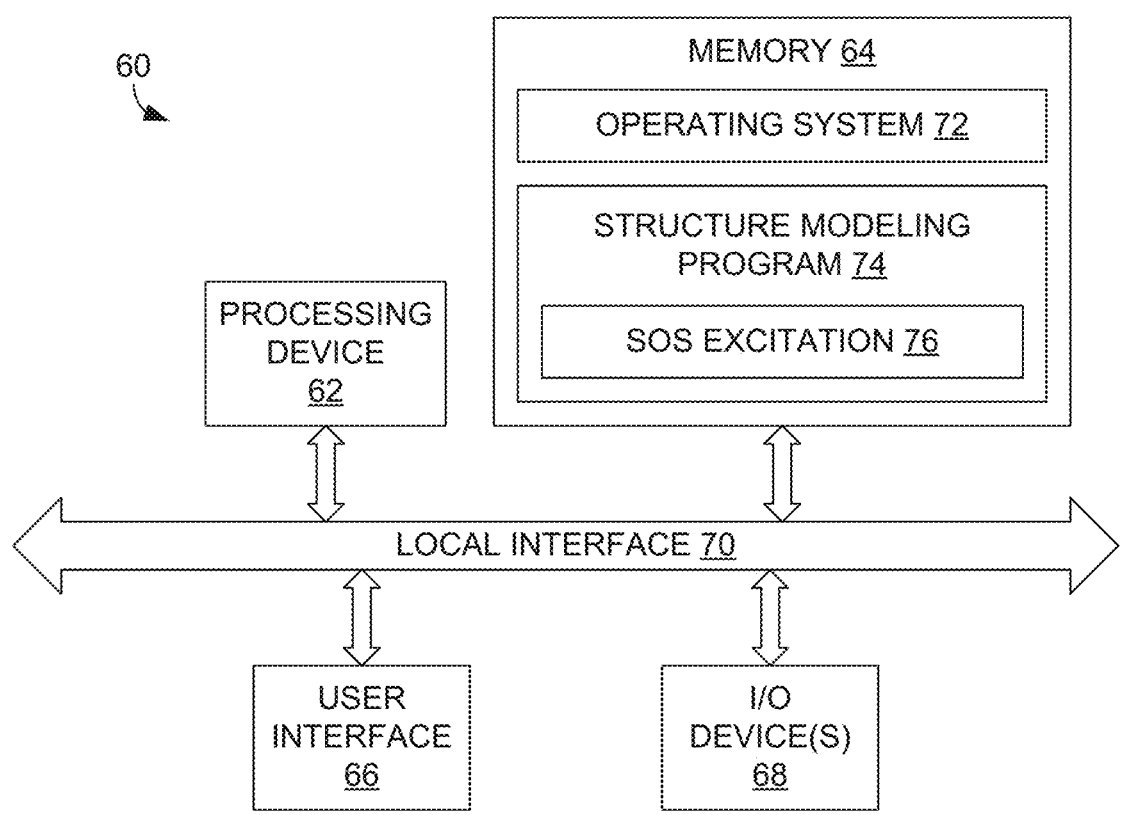
FIG. 6 is a block diagram of an embodiment of a computing device that can be used to determine a natural frequency of a structure.

FIG. 6 is a block diagram of an example embodiment for a computing device 60 that can be used to practice the disclosed methods. The computing device 60 generally comprises a processing device 62, memory 64, a user interface 66, and one or more input/output (I/O) devices 68, each of which is connected to a system bus 70. The processing device 62 can, for example, include a central processing unit (CPU) that is capable of executing computer-executable instructions stored within the memory 64. The memory 64 can include any one of or a combination of volatile memory elements (e.g., RAM, flash, etc.) and non-volatile memory elements (e.g., hard disk, ROM, etc.). The user interface 66 can comprise one or more devices that can enter user inputs into the computing device 60, such as a keyboard and mouse, as well as one or more devices that can convey information to the user, such as a display. The I/O devices 68 can comprise components that enable the computing device 14 to communicate with other devices, such as a network adapter.

The memory 64 (a non-transitory computer-readable medium) stores software applications (programs) including an operating system 72 and a structure modeling program 74 in which a synthesized sum of sines excitation 76 can be input. The structure modeling program 74 includes computer-executable instructions, which may be comprised by one or more algorithms (i.e., computer logic), which can be executed by the processing device 62. As described above, the structure modeling program 74 and the synthesized sum of sines excitation 76 (algorithm) can be used to determine the natural frequency of a structure.

Advantages of the disclosed synthesized sum of sines excitation techniques enable one to determine the natural frequencies of a structure at different strain levels (both low and high). The disclosed embodiments can be used with conventional software that does not have a means to determine natural frequency, as well as with software that does determine natural frequency but not at higher strain levels. The disclosed techniques also ensure that the natural frequency at the first mode of vibration is obtained, eliminating erroneous frequency estimation.

In light of the principles and example embodiments described and depicted herein, it will be recognized that the example embodiments can be modified in arrangement and detail without departing from such principles. Also, the foregoing discussion has focused on particular embodiments, but other configurations are also contemplated. Even though expressions such as "in one embodiment," "in another embodiment," or the like are used herein, these phrases are meant to generally reference embodiment possibilities, and are not intended to limit the invention to particular embodiment configurations. As used herein, these terms may reference the same or different embodiments that are combinable into other embodiments. As a rule, any embodiment referenced herein is freely combinable with any one or more of the other embodiments referenced herein, and any number of features of different embodiments are combinable with one another, unless indicated otherwise.

Similarly, although example methods or processes have been described with regard to particular steps or operations performed in a particular sequence, numerous modifications could be applied to those methods or processes to derive numerous alternative embodiments of the present invention. For example, alternative embodiments may include methods or processes that use fewer than all of the disclosed steps or operations, methods or processes that use additional steps or operations, and methods or processes in which the individual steps or operations disclosed herein are combined, subdivided, rearranged, or otherwise altered. This disclosure describes one or more embodiments wherein various operations are performed by certain systems, applications, modules, components, etc. In alternative embodiments, however, those operations could be performed by different components. Also, items such as applications, modules, components, etc., may be implemented as software constructs stored in a machine accessible storage medium, such as an optical disk, a hard disk drive, etc., and those constructs may take the form of applications, programs, subroutines, instructions, objects, methods, classes, or any other suitable form of control logic; such items may also be implemented as firmware or hardware, or as any combination of software, firmware and hardware, or any combination of any two of software, firmware and hardware. It will also be appreciated by those skilled in the art that embodiments may be implemented using conventional memory in applied computing systems (e.g., local memory, virtual memory, and/or cloud-based memory). The term "processor" may refer to one or more processors.

This disclosure may include descriptions of various benefits and advantages that may be provided by various embodiments. One, some, all, or different benefits or advantages may be provided by different embodiments. In view of the wide variety of useful permutations that may be readily derived from the example embodiments described herein, this detailed description is intended to be illustrative only, and should not be taken as limiting the scope of the invention. What is claimed as the invention, therefore, are all implementations that come within the scope of the following claims, and all equivalents to such implementations.

What is claimed is:

1. A method for determining a natural frequency of a structure, the method comprising:
   modeling the structure;
   creating a synthesized sum of sines excitation comprising all possible sinusoidal waves within a defined range of frequencies;
   applying the synthesized sum of sines excitation to a base of the modeled structure; and
   generating response data indicative of a natural frequency of the modeled structure that is based upon the application of the synthesized sum of sines excitation.

2. The method of claim 1, wherein the structure comprises an earthen structure.

3. The method of claim 1, wherein modeling the structure comprises computer modeling the structure.

4. The method of claim 3, wherein computer modeling the structure further comprises selecting and inputting a plurality of parameters that define the nature of the structure.

5. The method of claim 4, wherein the plurality of parameters include each of a zone parameter, a material property, a boundary parameter, and a geometry parameter.

6. The method of claim 1, wherein creating a synthesized sum of sines excitation further comprises creating the synthesized sum of sines excitation using the following equation:

$$Acc(t) = \frac{PHA}{\max\left(\sum_{i=1}^{i=F/f} \sin(2*\pi*f*i*t)\right)} \sum_{i=1}^{i=F/f} \sin(2*\pi*f*i*t);$$

$$0 \sec \leq t \leq T \sec$$

wherein PHA is a peak horizontal acceleration, F is an upper limit of a frequency range, f is a resolution of a frequency scale, t is a time instant, and T is a time duration.

7. The method of claim 6, wherein creating a synthesized sum of sines excitation further comprises selecting parameter for each of PHA, F, f, t, and T.

8. The method of claim 1, further comprising applying multiple synthesized sum of sines excitations having different peak horizontal acceleration values to the modeled structure to determine how the natural frequency changes as a function of an intensity of the synthesized sum of sines excitation.

9. The method of claim 8, further comprising plotting the natural frequencies as a function of strain.

10. The method of claim 1, wherein generating response data indicative of a natural frequency of the modeled structure comprises plotting the response as an amplitude versus frequency.

11. A system for determining a natural frequency of a structure, the system comprising:
   a computing device comprising a processing device; and
   a non-transitory computer-readable medium that stores computer-executable instructions configured to:
      computer model the structure,
      create a synthesized sum of sines excitation comprising all possible sinusoidal waves within a defined range of frequencies,
      apply the synthesized sum of sines excitation to a base of the modeled structure; and
      generate response data indicative of a natural frequency of the modeled structure that is based upon the application of the synthesized sum of sines excitation.

12. The system of claim 11, wherein the computer-executable instructions configured to computer model the structure comprise instructions configured to receive a plurality of parameters that define the nature of the structure, the parameters including each of a zone parameter, a material property, a boundary parameter, and a geometry parameter.

13. The system of claim 11, wherein the sum of sines excitation is defined as:

$$Acc(t) = \frac{PHA}{\max\left(\sum_{i=1}^{i=F/f} \sin(2*\pi*f*i*t)\right)} \sum_{i=1}^{i=F/f} \sin(2*\pi*f*i*t);$$

$$0 \sec \leq t \leq T \sec$$

wherein PHA is a peak horizontal acceleration, F is an upper limit of a frequency range, f is a resolution of a frequency scale, t is a time instant, and T is a time duration.

14. The system of claim 13, wherein the computer-executable instructions configured to create a synthesized sum of sines excitation comprise instructions configured to receive input parameters for each of PHA, F, f, t, and T.

15. The system of claim 11, wherein the computer-executable instructions configured to generate response data indicative of a natural frequency comprise instructions configured to plot the natural frequencies as a function of strain.

16. The system of claim 15, further comprising a display configured to display the plot.

* * * * *